US008698568B2

United States Patent
Lin et al.

(10) Patent No.: US 8,698,568 B2
(45) Date of Patent: Apr. 15, 2014

(54) AUTOMATIC SELF-CALIBRATED OSCILLATION METHOD AND APPARATUS USING THE SAME

(75) Inventors: Song Sheng Lin, Hsinchu (TW); Chia-Yi Chu, Hsinchu (TW)

(73) Assignee: Silicon Integrated Systems Corp., Hsinchu (TW)

( * ) Notice: Subject to any disclaimer, the term of this patent is extended or adjusted under 35 U.S.C. 154(b) by 52 days.

(21) Appl. No.: 13/456,441

(22) Filed: Apr. 26, 2012

(65) Prior Publication Data

US 2013/0285753 A1   Oct. 31, 2013

(51) Int. Cl.
*H03L 7/00* (2006.01)
(52) U.S. Cl.
USPC .................................. 331/44; 331/34; 331/17
(58) Field of Classification Search
USPC .................... 331/1 R, 16, 17, 34, 44, 175
See application file for complete search history.

(56) References Cited

U.S. PATENT DOCUMENTS

| | | | | |
|---|---|---|---|---|
| 4,677,394 A * | 6/1987 | Vollmer | ........................ | 331/1 A |
| 5,334,952 A * | 8/1994 | Maddy et al. | ................. | 331/1 A |
| 5,473,284 A * | 12/1995 | Jantti et al. | ...................... | 331/10 |
| 6,297,705 B1 * | 10/2001 | Williams et al. | ................ | 331/44 |
| 6,686,804 B1 * | 2/2004 | Adams et al. | ..................... | 331/17 |
| 7,103,337 B2 * | 9/2006 | Uozumi et al. | ................ | 455/255 |
| 7,609,122 B2 * | 10/2009 | Jian et al. | ....................... | 331/179 |
| 8,004,367 B2 * | 8/2011 | Kythakyapuzha et al. | ... | 331/179 |
| 8,130,046 B2 * | 3/2012 | Kwok | .............................. | 331/16 |
| 8,130,047 B2 * | 3/2012 | Finocchiaro et al. | ........... | 331/16 |
| 2009/0042528 A1 * | 2/2009 | Pellerano et al. | ............. | 455/260 |

* cited by examiner

*Primary Examiner* — Levi Gannon
(74) *Attorney, Agent, or Firm* — Morris Manning & Martin LLP; Tim Tingkang Xia, Esq.

(57) ABSTRACT

An automatic self-calibrated oscillation method and an apparatus using the same are provided. After a static time tuning (STT) table and a run time tuning (RTT) table have been established, the apparatus converts an output clock signal to generate a current RTT value at every predefined time and then compares the current RTT value with a reference RTT value generated in response to a STT value of the STT table, or with an interpolated result generated in response to the reference RTT value to generate a deviation value. Thus, through the deviation value, the output clock signal may be calibrated to address the target frequency without the assistance of external reference clock unit or locked loop unit after the STT table and the RTT table are established.

18 Claims, 6 Drawing Sheets

AUTOMATIC SELF-CALIBRATED OSCILLATION METHOD AND APPARATUS USING THE SAME

BACKGROUND

1. Technical Field

The disclosure relates to an oscillation circuit which provides an output clock signal to a processor and more particularly to an automatic self-calibrated oscillation method and an apparatus using the same.

2. Related Art

Accurate clock generators or timing references have generally relied upon crystal oscillators, such as quartz oscillators, which provide a mechanical, resonant vibration at a particular frequency. The difficulty with such crystal oscillators is that they cannot be fabricated as part of the same integrated circuit ("IC") driven by their clock signal. For example, microprocessors require a separate clock IC. As a consequence, an off-chip clock generator is desired for a circuit requiring an accurate clock signal.

There are several consequences for such non-integrated solutions. The non-integrated solutions, where an additional IC is required, increase space and area requirements, whether on the PCB or within the finished product, which is also detrimental in mobile environments. Moreover, such additional components increase manufacturing and production costs, as an additional IC must be fabricated and assembled with the primary circuitry (such as a microprocessor).

Other clock generators which have been produced as integrated circuits with other circuits are generally not very accurate, particularly over fabrication process, voltage and temperature ("PVT") variations. For example, ring, relaxation and phase shift oscillators may provide a clock signal suitable for some low-sensitivity applications, but have been incapable of providing the higher accuracy required in more sophisticated electronics, such as in applications requiring significant processing capability. In addition, these clock generators or oscillators often exhibit considerable frequency drift, jitter, have a comparatively low Q-value, and are subject to other distortions from noise and other interference.

As a consequence, it is necessary to develop an apparatus for automatic self-calibrated oscillation.

SUMMARY

The disclosure provides an apparatus for automatic self-calibrated oscillation and being implemented in a processor, and the apparatus comprises a STT table, a RTT table, a processing unit, a signal conversion circuit, and an oscillation circuit. The STT table preserves STT values including a target STT value corresponding to a tunable target frequency of the apparatus. The RTT table preserves RTT values each of which is generated in response to one of the STT values. The RTT values include a reference RTT value corresponding to the target STT value. The oscillation circuit outputs the output clock signal according to the target STT value. The signal conversion circuit converts the output clock signal every predefined time to a first digital signal. The processing unit transforms the first digital signal to a current RTT value and then controls the oscillation circuit to automatically calibrate the output clock signal to address the tunable target frequency according to a deviation value generated by comparing the current RTT value with the reference RTT value or with an interpolated RTT value which is generated in response to the reference RTT value.

Thereby, the processing unit controls the apparatus to operate under a normal operation mode to automatically calibrate the output clock signal to address the target frequency in response to the deviation value.

Moreover, the disclosure also provides an automatic self-calibrated oscillation method which is performed in an apparatus to maintain a frequency of an output clock signal at a tunable target frequency. Firstly, a STT table and a RTT table are provided, wherein the STT table includes STT values including a target STT value corresponding to the tunable target frequency, and the RTT table includes RTT values corresponding to the STT values.

Subsequently, a current RTT value is obtained every predefined time in response to the output clock signal, and a reference RTT value corresponding to the target STT value, or an interpolated RTT value generated in response to the reference RTT is obtained by looking up the RTT table. A deviation value is generated by comparing the current RTT value with the reference RTT value or with the interpolated RTT value and is used to compensate the output clock signal.

For purposes of summarizing, some aspects, advantages and features of some embodiments of the disclosure have been described in this summary. Not necessarily all of (or any of) these summarized aspects, advantages or features will be embodied in any particular embodiment of the disclosure. Some of these summarized aspects, advantages and features and other aspects, advantages and features may become more fully apparent from the following detailed description and the appended claims.

BRIEF DESCRIPTION OF THE DRAWINGS

The disclosure will become more fully understood from the detailed description given herein below for illustration only, and thus are not limitative of the disclosure, and wherein.

DETAILED DESCRIPTION

The detailed features and advantages of the disclosure are described below in great detail through the following embodiments, the content of which is sufficient for those of ordinary skill in the art to understand the technical content of the disclosure and to implement the disclosure accordingly. Based upon the content of the specification, the claims, and the drawings, those of ordinary skill in the art can easily understand the relevant objectives and advantages of the disclosure.

The disclosure provides an automatic self-calibrated oscillation method and an apparatus using the same both of which may be implemented in a processor which may be implemented in any electrical device.

Figure 1:
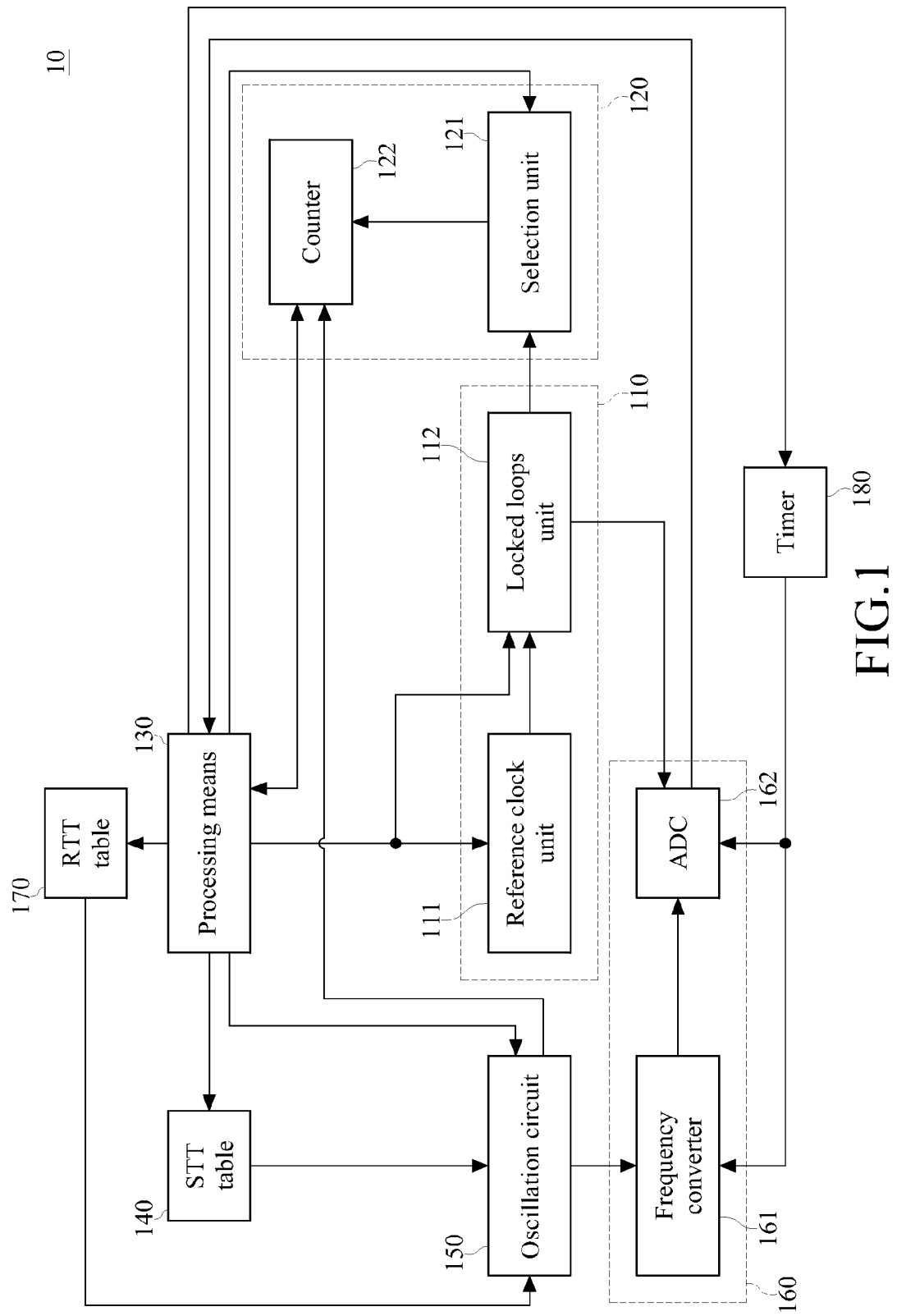
FIG. 1 is a block diagram of an apparatus for automatic self-calibrated oscillation apparatus of the disclosure.

FIG. 1 illustrates a block diagram of an apparatus for automatic self-calibrated oscillation apparatus of the disclosure. The apparatus 10 includes a reference generation circuit 110, a calibration circuit 120, a processing means 130, a static time tuning (STT) table 140, an oscillation circuit 150, a conversion circuit 160, a run time tuning (RTT) table 170 and a timer 180.

The processing means 130 communicates with every element in the apparatus 10 and controls the operation of each element in the apparatus 10 so as to control the apparatus 10 operates under an initial mode, a run time mode and a normal operation mode. The initial mode indicates the period during which the apparatus 10 has just driven to establish the STT table 140. The run time mode indicates the period during which the apparatus 10 has operated for establishing the RTT table 170 after the initial mode. The normal operation mode indicates the period during which the apparatus 10 operates according to the STT table 140 and the RTT table 170 after the run time mode.

In one embodiment, the processing means 130 is a firmware of the processor. In another embodiment, the processing means 130 may be a hardware implemented in the processor. The operations of the initial mode, the run time mode and the normal operation mode are described as below.

Figure 2A:
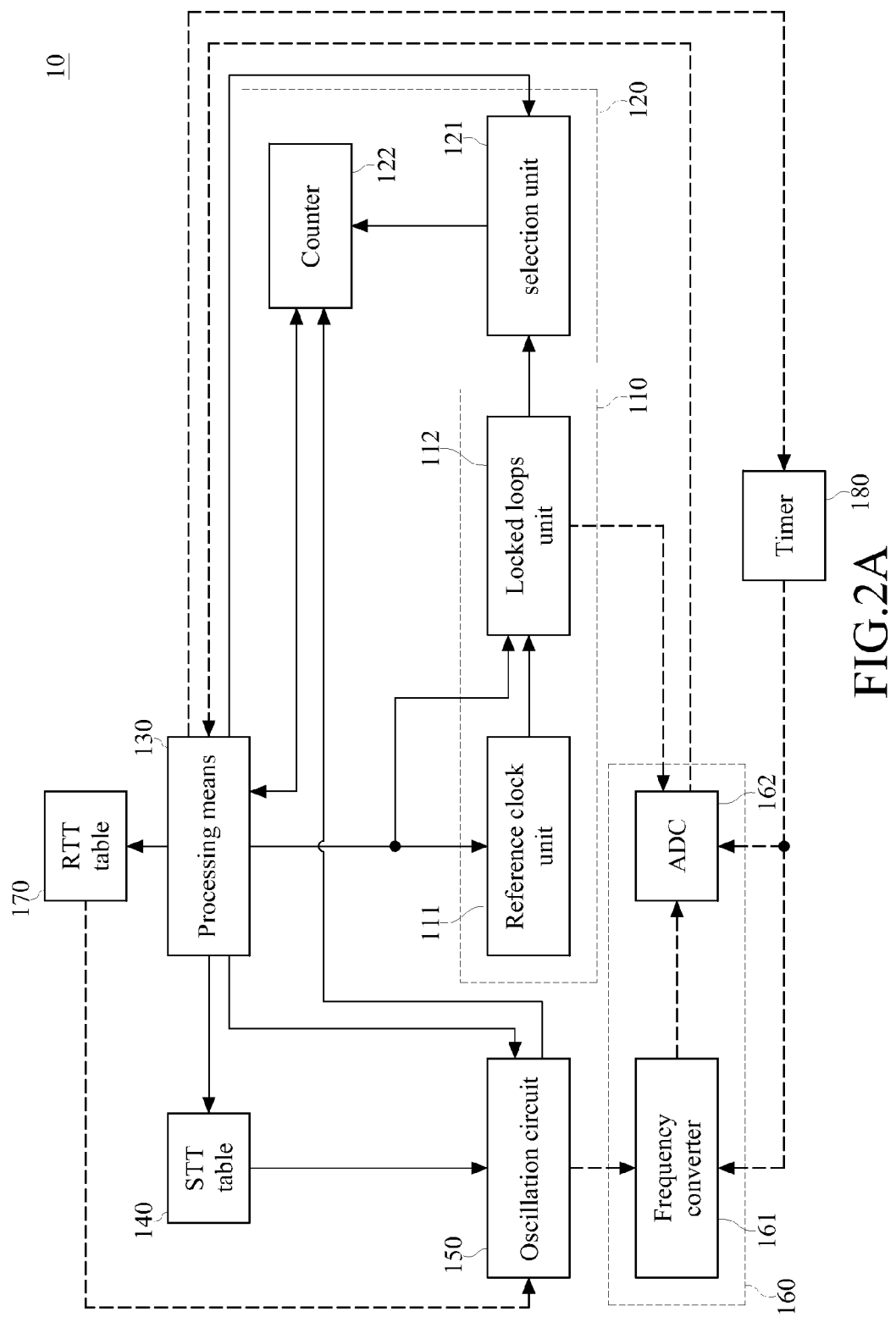
FIG. 2A is a block diagram of an apparatus for automatic self-calibrated oscillation apparatus under an initial mode according to FIG. 1.

FIG. 2A illustrates a block diagram of an apparatus for automatic self-calibrated oscillation apparatus under an initial mode according to FIG. 1. Under the initial mode, the reference generation circuit 110, the calibration circuit 120, the STT table 140 and the oscillation circuit 150 are enabled and functioning according to the control of the processing means 130. The communication channels among the elements enabled by the processing means 130 are marked with solid lines, and the communication channels among the elements disabled are marked with dash lines.

The reference generation circuit 110 includes a reference clock unit 111 and a locked loops unit 112. The reference clock unit 111 communicates with the processing means 130 and the locked loops unit 112 and provides an initial clock signal to the locked loops unit 112. The locked loops unit 112 communicates with the calibration circuit 120 and generates a plurality of references signals according to the initial clock signal. The locked loops unit 112 may be a phase-locked loop (PLL) or a delay locked loops (DLL).

The calibration circuit 120 includes a selection unit 121 and a counter 122. The selection unit 121 communicates with the locked loops unit 112, the counter 122 and the processing means 130 and selects one of the reference signals as a target reference signal according to the control of the processing means 130. The counter 122 communicates with the processing means 130 and the oscillation circuit 150 and counts the target reference signal according to an output clock signal outputted from the oscillation circuit 150. The selection unit 121 may be a multiplexer or other circuit.

Moreover, the processing means 130 transforms the counting result of the counter 122 to a STT value which may indicates a frequency value of the output clock signal under the initial mode, so as to build up the STT table 140. The STT table 140 may be a table or other type integrated information and be stored in a register or a storage device both of which are implemented in the processor. The register or the storage device preserving the STT table 140 communicates with the processing means 130 and the oscillation circuit 150.

Thereby, the processing means 130 controls the oscillation circuit 150 to output the output clock signal according to the STT value. Through the process, the output clock signal may be updated via the STT value so as to satisfy the operation target requirement based on process variation. The oscillation circuit 150 may be a LC oscillator, a relaxation oscillator, a phase shift oscillator, or other type of tunable free-running clock generator.

However, generally, the output clock signal may be shifted or effected due to, for example, temperature variation, voltage variation, or lifetime degradation. For improvement of the situation, the processing means 130 further controls the apparatus 10 to operate under a run time mode, which is described as below.

Figure 2B:
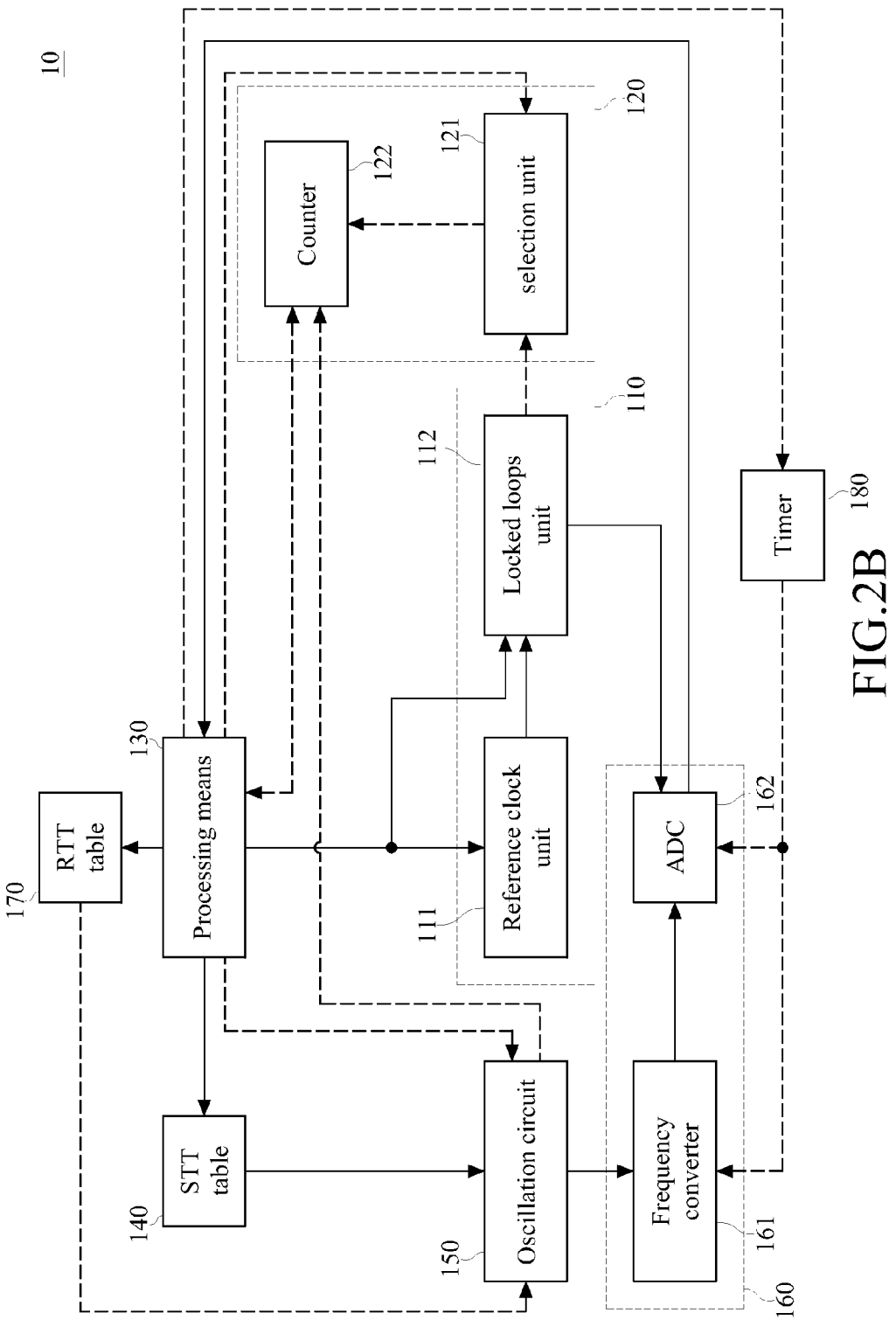
FIG. 2B is a block diagram of an apparatus for automatic self-calibrated oscillation apparatus under a run time mode according to FIG. 1.

As shown in FIG. 2B, under the run time mode, the reference generation circuit 110, the STT table 140, the oscillation circuit 150, the signal conversion circuit 160 and the RTT table 170 are enabled and function according to the control of the processing means 130. The communication channels among the elements enabled by the processing means 130 are marked with solid lines, and the communication channels among the elements disabled are marked with dash lines.

The signal conversion circuit 160 includes a frequency converter 161 and an analog to digital converter (ADC) 162. The frequency converter 161 communicates with the oscillation circuit 150 and the ADC 162. The frequency converter 161 converts the output clock signal to an analog signal. The ADC 162 communicates with the locked loops unit 112 and converts the analog signal to a digital signal according to the target reference signal. The frequency converter 161 may be a frequency to voltage converter, a frequency to current converter, or other similar type converter.

Thus, the processing means 130 transforms the digital signal to generate a RTT value which may indicate a frequency value of the output clock signal under the run time mode, so as to establish the RTT table 170 in response to each or a group of tunable settings. The RTT table 170 may be a table or other type integrated information and be stored in a register or a storage device both of which are implemented in the processor. The register or the storage device preserving the RTT table 170 communicates with the processing means 130.

After establishment of the STT table 140 and the RTT table 170, the processing means 130 further controls the apparatus 10 to operate under the normal operation mode. The operation among the elements in the apparatus 10 is described as below.

Figure 2C:
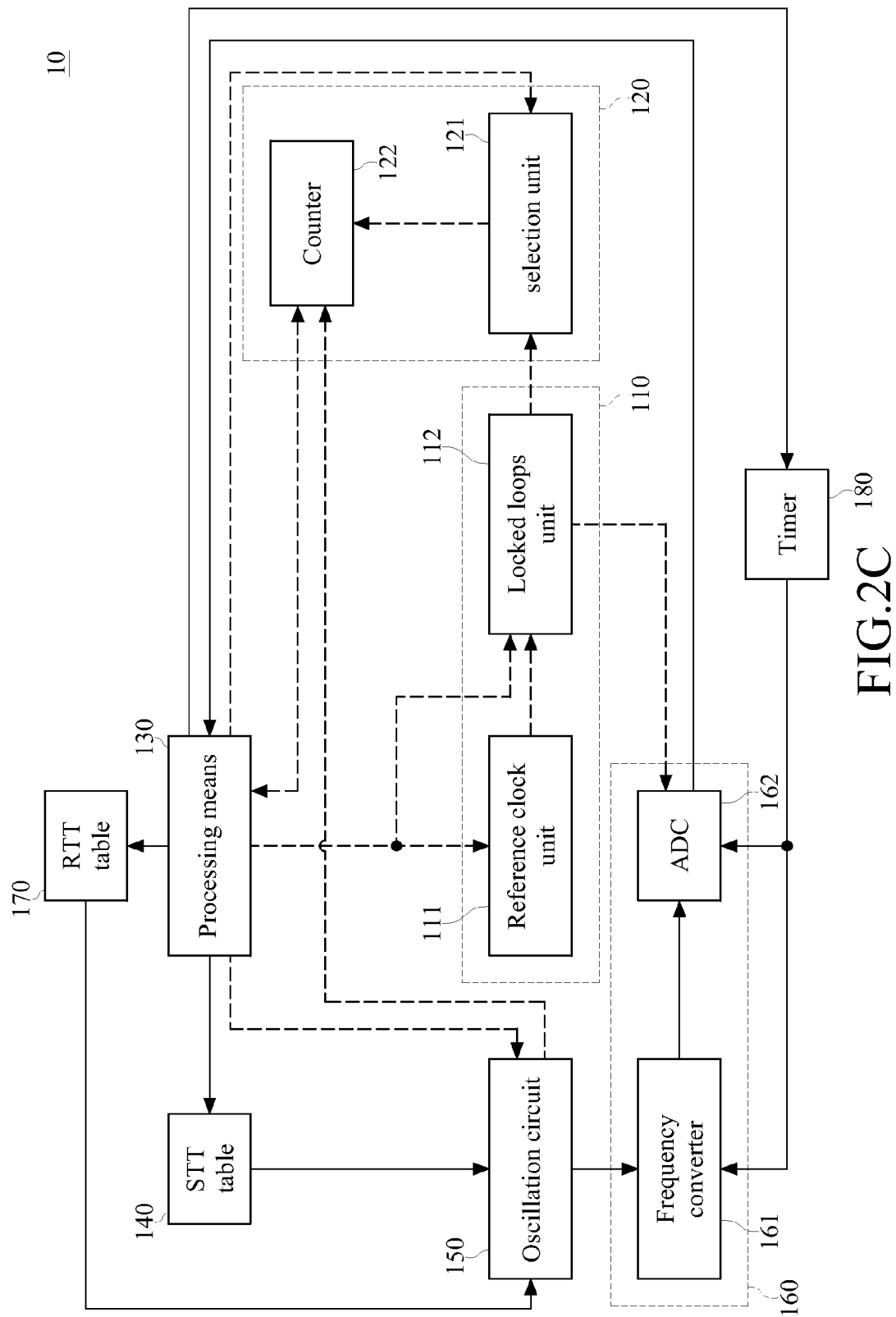
FIG. 2C is a block diagram of an apparatus for automatic self-calibrated oscillation apparatus under a normal operation mode according to FIG. 1.

As shown in FIG. 2C, under the normal operation mode, the STT table 140, the oscillation circuit 150, the signal conversion circuit 160, the RTT table 170 and the timer 180 are enabled and functioning according to the control of the processing means 130. The communication channels among the elements enabled by the processing means 130 are marked with solid lines, and the communication channels among the elements disabled are marked with dash lines.

The timer 180 communicates with the processing means 130, the frequency converter 161 and the ADC 162. The processing means 130 controls the timer 180 to clock a predefined time so as to enable the frequency converter 161 and the ADC 162. When the frequency converter 161 and the ADC 162 are enabled, the frequency converter 161 converts the output clock signal to generate an analog signal, and the ADC 162 converts the analog signal to generate a digital signal.

The processing means 130 can transform the digital signal to generate a current RTT value and then compare the current RTT value with a reference RTT value or with an interpolated RTT value to generate a deviation value. The reference RTT value is recorded in the RTT table 170 and formed according to a target STT value which satisfies the tunable target frequency of the processor. The interpolated RTT value is formed by means of interpolation of adjacent RTT values when the current RTT value is not found in the RTT table.

Thus, the processing means 130 can compensate the current RTT value according to the deviation value and controls the oscillation circuit 150 to update the output clock signal so as to achieve the tunable target frequency of the processor.

Figure 3:
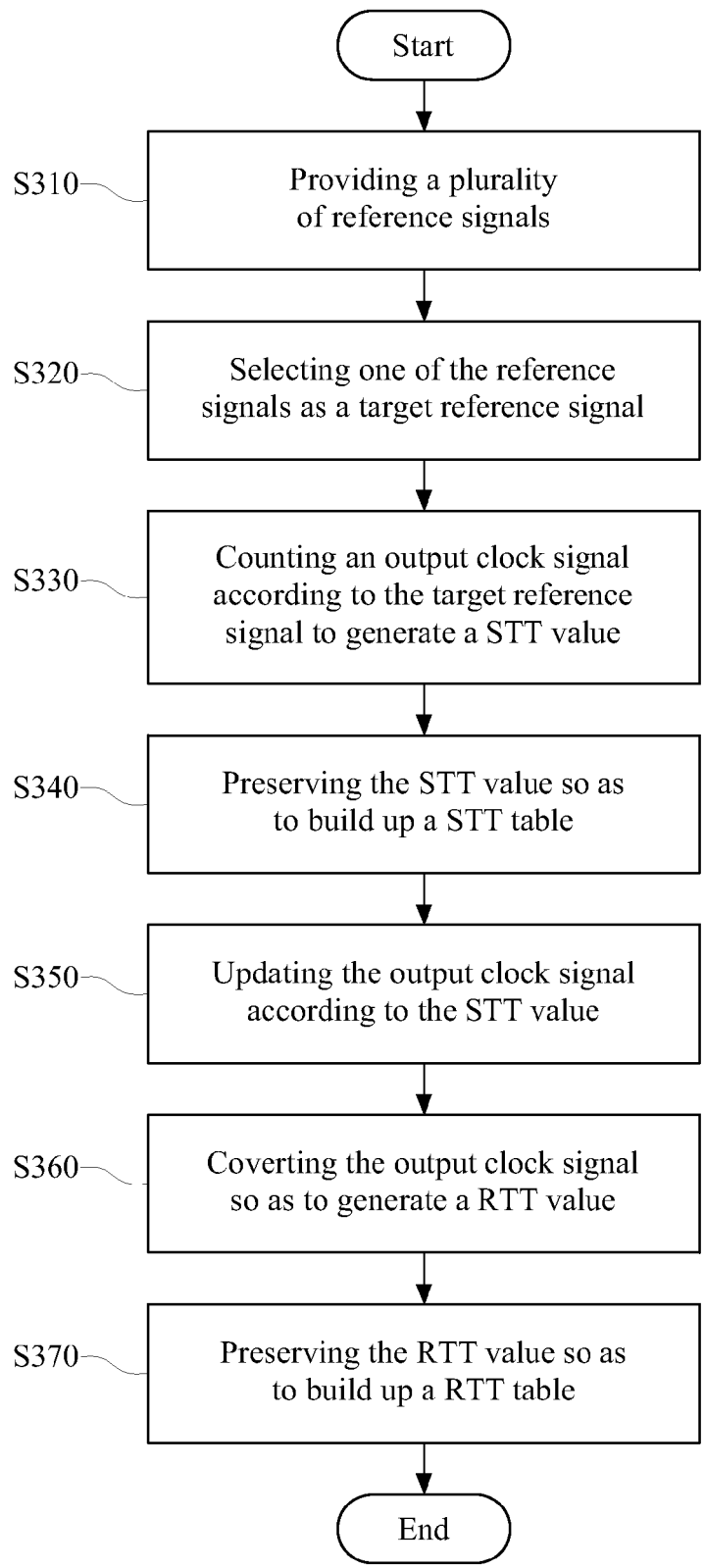
FIG. 3 is a flow chart of an automatic self-calibrated oscillation method according to FIGS. 2A and 2B.

FIG. 3 illustrates a flow chart of an automatic self-calibrated oscillation method according to FIGS. 2A and 2B. Firstly, a plurality of reference signals are provided (step S310). When the apparatus 10 is just enabled, the processing means 130 controls the apparatus 10 to operate under an initial mode. The processing means 130 enables the reference generation circuit 110 to provide an initial clock signal and controls the locked loops unit 112 to generate the reference signals.

One of the reference signals is selected as a target reference signal (step S320). The processing means 130 controls the selection unit 121 to select the target reference signal from the reference signals according to a tunable target frequency of the processor.

An output clock signal which has an initial frequency based on the specification of the oscillation circuit 150 is counted so as to generate a STT value (step S330). The processing means 130 enables the oscillation circuit 150 to output the output clock signal and enables the counter 122 to count the output clock signal according to the target reference signal so as to generate the STT value. Then, the STT value is preserved so as to establish a STT table 140 (step S340). Thereby, the output clock signal is updated according to the STT value to satisfy the tunable target frequency (step S350).

Accordingly, the updated output clock signal is converted so as to generate a RTT value (step S360). After the output clock signal is updated according to the STT value, the processing means 130 enables the signal conversion circuit 160 to convert the updated output clock signal to generate a digital signal. Then, the processing means 130 transforms the digital signal to generate a RTT value. Eventually, the RTT value is preserved so as to establish a RTT table 170 (step SS370).

Figure 4:
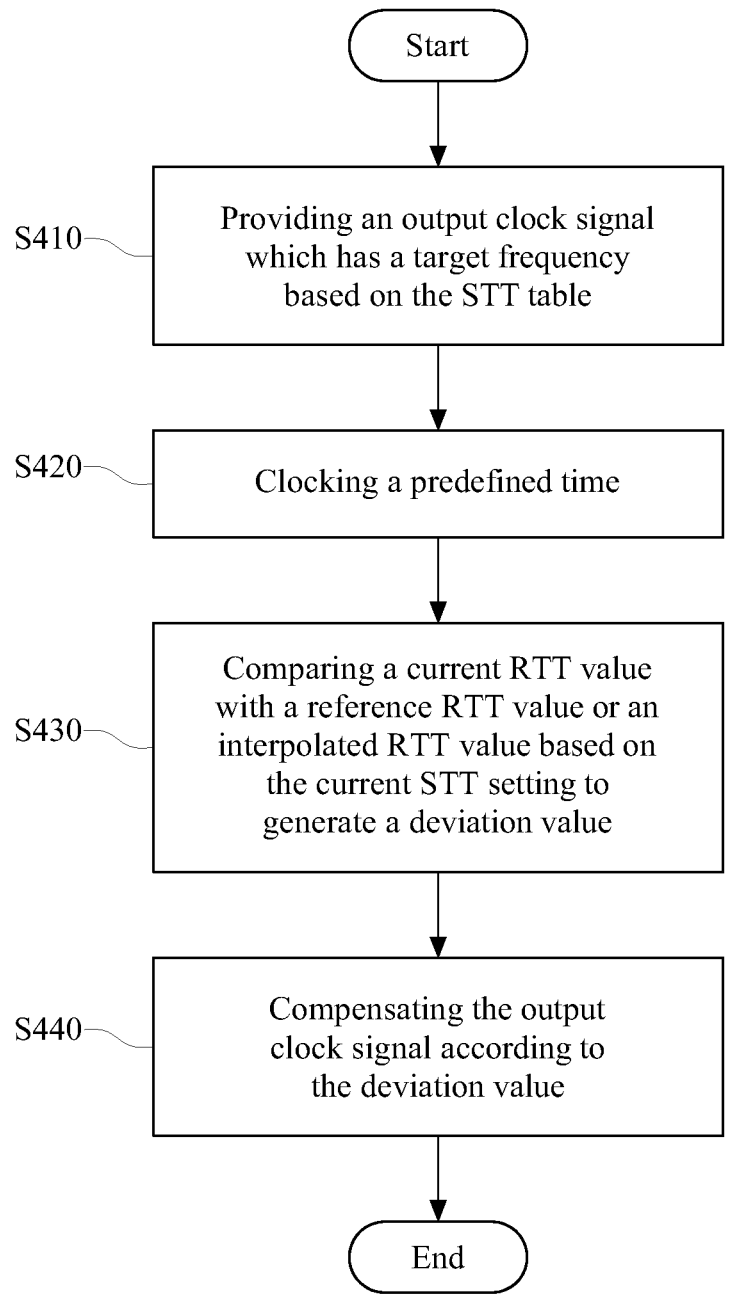
FIG. 4 is a flow chart of an automatic self-calibrated oscillation method according to FIG. 2C.

FIG. 4 illustrates a flow chart of an automatic self-calibrated oscillation method according to FIG. 2C. Firstly, an output clock signal which has a tunable target frequency is provided in accordance with a target STT value (step S410). After the STT table 140 and the RTT table 170 are established according to FIG. 3, the processing means 130 controls the apparatus 10 to operate under a normal operation mode. The processing means 130 enables the oscillation circuit 150 provides the output clock signal according to the target STT value recorded in the STT table 140.

After that, a predefined time is clocked (step S420). After the output clock signal is provided according to the target STT value, the processing means 130 enables the timer 180 to count the predefined time. Whenever it has done to count the predefined time, the processing means 130 enables the signal conversion circuit 160 to convert the output clock signal to generate a digital signal. Then, the digital signal is transformed by the processing means 130 to generate a current RTT value.

Accordingly, the current RTT value is compared with a reference RTT value or with an interpolated RTT value to generate a deviation value (step S430). The reference RTT value is recorded in the RTT table 170 and formed according to a target STT value which satisfies the tunable target frequency of the processor. The interpolated RTT value is formed by means of interpolation of adjacent RTT values when the current RTT value is not found in the RTT table 170. In one embodiment, the processing means 130 subtracts the current RTT value from the reference RTT value or from the interpolated RTT value to generate the deviation value, but such an embodiment should not be a limitation throughout the disclosure.

Thus, the output clock signal may be updated by compensating the output clock signal according to the deviation value (step S440). Through the process, the output clock signal can address the tunable target frequency.

Through above STT table 140 and RTT table 170, the disclosure automatically calibrates the frequency of the output clock signal of the apparatus 10 to maintain at a tunable target frequency.

The disclosure may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. An apparatus for automatic self-calibrated oscillation and being implemented in a processor, comprising:
a STT (static time tuning) table for preserving a plurality of STT values comprising a target STT value corresponding to a tunable target frequency of the apparatus;
a RTT (run time tuning) table for preserving a plurality of RTT values each of which is generated in response to one of the STT values, wherein the RTT values comprise a reference RTT value corresponding to the target STT value;
an oscillation circuit for outputting the output clock signal according to the target STT value;
a signal conversion circuit for converting the output clock signal every predefined time to a first digital signal; and
a processing unit for transforming the first digital signal to a current RTT value and then controlling the oscillation circuit to automatically calibrate the output clock signal to address the tunable target frequency according to a deviation value generated by comparing the current RTT value with the reference RTT value or with an interpolated RTT value which is generated in response to the reference RTT value,
wherein the STT values in the STT table and the RTT values in the RTT table are defined before a normal operation mode and maintained during the normal operation mode.

2. The apparatus according to claim 1, wherein the signal conversion circuit comprising:
a frequency converter for converting the output clock signal every predefined time to an analog signal; and
an analog to digital converter for converting the analog signal to the first digital signal.

3. The apparatus according to claim 1, further comprising:
a timer for being enabled by the processing unit and counting every predefined time to enable the signal conversion circuit.

4. The apparatus according to claim 1, wherein the STT table is established and the STT values in the STT table are defined when the apparatus operates under an initial mode, the RTT table is established and the RTT values in the RTT table are defined when the apparatus operates under a run time table mode after the STT table is established, and the processing unit controls the oscillation circuit to automatically calibrate the output clock signal every predefined time when the apparatus operates under the normal operation mode after the STT table and the RTT table are established.

5. The apparatus according to claim 4, wherein the signal conversion circuit comprises:
a frequency converter for converting the output clock signal to a first analog signal when the apparatus operates under the run time table mode, and converting the output clock signal every predefined time to an second analog signal when the apparatus operates under the normal operation mode; and
an analog to digital converter for converting the first analog signal under the run time table mode to a second digital signal and converting the second analog signal under the normal operation mode to the first digital signal;
wherein the processing unit under the run time table mode transforms the second digital signal to one of the RTT values preserved in the RTT table.

6. The apparatus according to claim 4, further comprising:
a reference generation circuit for being controlled by the processing unit, providing a plurality of reference signals under the initial mode and providing a target reference signal of the reference signals under the run time table mode;
a calibration circuit for being controlled and enabled by the processing unit only under the initial mode to select one of the reference signals as the target reference signal and provide a frequency value of the output clock signal in response to the target reference signal and the output clock signal, and after which, the processing unit under initial mode transforms the frequency value to a current STT value, preserves the current STT value in the STT table and controls the oscillation circuit to update the output clock signal according to the current STT value.

7. The apparatus according to claim 6, wherein the reference generation circuit comprises:
a reference clock unit for being enabled by the processing unit under the initial mode and the run time table mode and providing an initial clock signal; and
a locked loops unit for generating the reference signals according to the initial clock signal, providing the reference signals to the calibration circuit under the initial mode, and providing the target reference signal of the reference signals to the signal conversion circuit under the run time table mode.

8. The apparatus according to claim 6, wherein the calibration circuit comprises:
a selection unit for being controlled by the processing unit to select the target reference signal from the reference signals according to the tunable target frequency; and
a counter for counting the output clock signal according to the target reference signal to generate the frequency value.

9. The apparatus according to claim 1, wherein the oscillation circuit is a tunable free-running clock generator.

10. The apparatus according to claim 1, wherein the processing unit is a firmware of the processor.

11. An automatic self-calibrated oscillation method for being performed in an apparatus to maintain a frequency of an output clock signal of the apparatus at a tunable target frequency, comprising:
providing a STT table comprising a plurality of STT values comprising a target STT value corresponding to the tunable target frequency, and a RTT table comprising a plurality of RTT values corresponding to the STT values;
obtaining a current RTT value every predefined time in response to the output clock signal;
looking up the RTT table to obtain a reference RTT value corresponding to the target STT value or to obtain an interpolated RTT value generated in response to the reference RTT;
comparing the current RTT value with the reference RTT value or with the interpolated RTT value to generate a deviation value; and
compensating the output clock signal using the deviation value,
wherein the STT values in the STT table and the RTT values in the RTT table are defined before a normal operation mode and maintained during the normal operation mode.

12. The automatic self-calibrated oscillation method according to claim 11, wherein the step of obtaining the current RTT value comprises:
updating the output clock signal according to one of the STT values after the STT table and the RTT table are provided;
converting the updated output clock signal to a digital signal; and
transforming the digital signal to the current RTT value.

13. The automatic self-calibrated oscillation method according to claim 12, wherein the step of converting the updated output clock signal to the digital signal comprises:
converting the updated output clock signal to an analog signal; and
converting the analog signal to the digital signal.

14. The automatic self-calibrated oscillation method according to claim 11, wherein the step of providing the STT table comprises:
providing a target reference signal;
counting the output clock signal according to the target reference signal to generate a frequency value of the output clock signal;
transforming the frequency value to one of the STT values; and
preserving the one of the STT value in the STT table.

15. The automatic self-calibrated oscillation method according to claim 14, wherein the step of providing the target reference signal comprising:
providing an initial signal;
generating a plurality of reference signals in response to the initial signal; and
selecting one of the reference signals as the target reference signal according to the tunable target frequency.

16. The automatic self-calibrated oscillation method according to claim 11, wherein the step of providing the RTT table is performed after the step of providing the STT table and comprises:
updating the output clock signal according to one of the STT values;
converting the updated output clock signal to generate a digital signal;
transforming the digital signal to one of the RTT values; and
preserving the one of the RTT values in the RTT table.

17. The automatic self-calibrated oscillation method according to claim 16, wherein the step of converting the updated output clock signal comprises:
converting the updated output clock signal to an analog signal; and
converting the analog signal to the digital signal.

18. The automatic self-calibrated oscillation method according to claim 11, wherein the deviation value is generated by subtracting the current RTT value from the reference RTT value or from the interpolated RTT value.

* * * * *